(12) United States Patent
Platzgummer et al.

(10) Patent No.: US 8,546,767 B2
(45) Date of Patent: Oct. 1, 2013

(54) PATTERN DEFINITION DEVICE WITH MULTIPLE MULTIBEAM ARRAY

(75) Inventors: Elmar Platzgummer, Vienna (AT); Hans Loeschner, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 273 days.

(21) Appl. No.: 12/959,270

(22) Filed: Dec. 2, 2010

(65) Prior Publication Data
US 2011/0204253 A1 Aug. 25, 2011

(30) Foreign Application Priority Data

Feb. 22, 2010 (EP) .................................. 10450027

(51) Int. Cl.
*G21K 1/08* (2006.01)
(52) U.S. Cl.
USPC ................ 250/396 R; 250/492.2; 250/492.22
(58) Field of Classification Search
USPC .................................................. 250/396 R
See application file for complete search history.

(56) References Cited

U.S. PATENT DOCUMENTS

| 6,768,125 | B2 | 7/2004 | Platzgummer et al. | |
|---|---|---|---|---|
| 7,084,411 | B2 * | 8/2006 | Lammer-Pachlinger et al. | 250/492.1 |
| 7,244,949 | B2 * | 7/2007 | Knippelmeyer et al. | 250/396 ML |
| 2008/0237460 | A1 | 10/2008 | Fragner et al. | |
| 2009/0146082 | A1 * | 6/2009 | Stengl et al. | 250/492.22 |
| 2009/0200495 | A1 | 8/2009 | Platzgummer | |

* cited by examiner

*Primary Examiner* — Phillip A Johnston
(74) *Attorney, Agent, or Firm* — Christie, Parker & Hale, LLP

(57) ABSTRACT

A multi-beam pattern definition device (102) for use in a particle-beam processing or inspection apparatus is configured to be irradiated with a beam (lp,bp) of electrically charged particles so as to form a number of beamlets to be imaged to a target. An aperture array means (202) comprises at least two sets of apertures (221, 222) for defining respective beamlets (b1-b5), wherein the sets of apertures comprise a plurality of apertures arranged in interlacing arrangements and the apertures of different sets are offset to each other by a common displacement vector (d12). An opening array means (201) has a plurality of openings (210) configured for the passage of a subset of beamlets corresponding to one of the sets of apertures but lacking openings (being opaque to the beam) at locations corresponding to the other sets of apertures. A positioning means shifts the aperture array means relative to the opening array means in order to selectively bring one of the sets of apertures into alignment with the openings in the opening array means.

13 Claims, 6 Drawing Sheets

PATTERN DEFINITION DEVICE WITH MULTIPLE MULTIBEAM ARRAY

CROSS-REFERENCE TO RELATED APPLICATION(S)

This application claims priority to and the benefit of European Patent Application Number 10450027.7, filed on Feb. 22, 2010.

FIELD OF THE INVENTION AND DESCRIPTION OF PRIOR ART

The invention relates to a multi-beam pattern definition device for use in a particle-beam processing or inspection apparatus, which device is adapted to be irradiated with a beam of electrically charged particles, in particular ions, and allow passage of the beam through a plurality of apertures thus forming a corresponding number of beamlets, said device comprising an aperture array means in which said apertures are realized, and an opening array means having a plurality of openings configured for the passage of at least a subset of beamlets that are formed by said apertures.

The invention also relates to methods using such a multi-beam pattern definition device, in particular in order to employ a multi-pass method for multi-beam writing in a particle-beam processing or inspection apparatus.

Particle lithography and processing is used in semiconductor production and microstructuring applications. In particular direct patterning by ion-beam irradiation is a promising concept for the future industrial fabrication of nano-scale devices with high resolutions, in particular the 32 nm and 22 nm nodes and below. The device to pattern the charged-particle beam (in particular, ion beam) so as to contain a desired design pattern—referred to as pattern definition device (PD device)—is, preferably, a programmable multi-aperture device in which the apertures are designed to form beamlets out of the beam that irradiates the device and are programmable to selectively keep some of the beamlets on their path and divert other beamlets so that the latter do not reach the substrate, in accordance with a desired design pattern to be produced on a target surface. The implementation of a multi-beam projection optical system based on a programmable multi-aperture plate allows a significant improvement of the achievable productivity in comparison with focused single beam systems. The reasons for the improved productivity are, firstly, the parallelism of the process using a plurality of beams and, secondly, the increased current which can be imaged to a substrate at the same resolution. Both are made possible by a significantly reduced Coulomb interaction in the beam. Furthermore, the moderate current density related to the projection optical system results in an enhanced process rate when precursor gases are used for beam-induced chemical processes. As compared with a focused beam system, also the reduced heating effect due to extreme beam intensity can be avoided.

A particle-beam apparatus and pertinent aperture-array means are disclosed in U.S. Pat. No. 6,768,125 and US 2009/0200495 A1 of the assignee/applicant. Those documents describes a charged-particle lithography and processing method and apparatus dubbed PML2 (short for "Projection Mask-Less Lithography") which realizes a multi-beam direct write concept and uses a programmable aperture plate system (APS) as a pattern definition (PD) device for structuring a particle beam, which is extracted from a single source of electrically charged particles.

The APS comprises a number of devices, typically realized as plates in a consecutive stack-like configuration, namely an aperture array means (aperture plate) and a deflection array means (blanking plate) and possibly additional opening array means such as a cover plate or interspersed correction plates. The aperture plate comprises an array of apertures which define a beam pattern, consisting of beamlets, to be projected on a target surface. Corresponding blanking openings on the blanking plate are associated with said apertures. Said blanking openings are located such that each of the beamlets traverses the blanking opening that corresponds to the aperture defining the beamlet respectively. Each blanking opening is provided with a beamlet deflection means that can be controlled by a blanking signal between two deflection states, namely, a first state ('switched on') when the beamlet deflection means has assumed a state in which particles passing through the opening are allowed to travel along a desired path, and a second state ('switched off') when the beamlet deflection means is deflecting particles transmitted through the opening off said path. An additional cover plate may be disposed in front of the other plates in order to protect the other plates from the impact of the incoming beam except for the regions which are formed into the beamlets. Furthermore, correction plates may be present for introducing certain corrections of the direction of the beamlets for achieving special imaging properties, such as compensation of imaging defects or modulation of the aberration of a crossover.

In the PML2 layout as disclosed in the U.S. Pat. No. 6,768,125 and related prior art the position of the patterned beam on the target is held fixed on the corresponding pixel positions only for the duration one pixel of the target takes to travel under the optical system. Then the patterned beam jumps to the position of the next pixel which is adjacent to the previous one. In this manner, each beamlet covers adjacent pixels on the target. A variant of this strategy that strongly reduces data transfers on and into the APS is discussed in US 2008/0237460 A1 of the assignee/applicant, wherein each beamlet stays locked on the (moving) position of the respective pixel on the target even for a longer duration, which corresponds to a pixel exposure cycle, even for a movement of the target by a distance covering multiple pixels. As a consequence, the beamlets are deflected accordingly by means of the deflection system of the imaging optics (deflectors 16 in FIG. 1).

The PD devices of the state of art have a fixed arrangement of apertures. Therefore, when a target is to be processed with pattern portions that have different critical dimension (i.e., linear dimension of the smallest feature to be produced), the PD device should be changed. It is a goal of the present invention to find a way to make a PD device more flexible and realize more than one geometry of aperture arrangements.

SUMMARY OF THE INVENTION

According to a first aspect of the invention, a multi-beam pattern definition device of the kind mentioned in the beginning and having an aperture array means and an opening array means is provided with "multiple multi-beam arrays" by virtue of the following provisions: The aperture array means comprises at least two sets of apertures, which each comprise a plurality of apertures arranged in a (substantially) regular arrangement on the aperture array means with the arrangements of said sets being interlacing at least partially, wherein the apertures of different sets are—at least in a region where the arrangements are interlacing—offset to each other by displacements which (substantially) correspond to a common displacement vector. In correspondence with this, the plurality of openings in the opening array which are configured for the passage of at least a subset of beamlets that are formed by said apertures, wherein, in at least a region corresponding to said region of interlacing of arrangements, the opening array means comprises plurality of openings arranged in a substantially regular arrangement, said arrangement corresponding to the arrangement of one of said sets of apertures in said region and lacking openings (so the opening array means is opaque there) at locations corresponding to apertures of the other set(s) of apertures.

Furthermore, advantageously positioning means are provided which can position the aperture array means and/or the opening array means, in order to adjust the position of the aperture array means and the opening array means relative to each other. These positioning means are configured to selectively bring one of the sets of apertures in the aperture array means, namely a selected set, into alignment with the plurality of openings in the opening array means, such that the apertures and openings are in alignment in at least said region of interlacing of arrangements.

In a typical realization of the invention, the apertures within each set will have equivalent shape and size, whereas the apertures of different sets may differ in their size and/or shape. Furthermore, in a suitable implementation of the invention the aperture array means and the at least one opening array means are realized as plate-like devices oriented substantially perpendicular to the beam, and having a membrane portion designed for being disposed in the path of the beam.

The invention allows the implementation of different values of critical dimension within one PD system, simply by switching the geometric spot size. The spot size is defined by the size of the aperture and thus can be selected by activation of a suitable aperture set. In particular, it is possible to select a larger spot size for less critical areas or pattern elements on the target, while a smaller spot size is used only for most critical pattern elements. This will enhance throughput of production.

Another advantage of the invention is that it allows adjustment of the current that passes through the projections system in view of the blur related to the Coulomb interaction, in particular when different ion species are used. In this context it is noted that a higher particle mass will cause a larger blur; this can be compensated by using a different beamlet width, which in turn causes a different total current of the beam (assuming that the number of beamlets is held constant).

Moreover, different aperture sets could be used for different tasks in a particle-beam apparatus, such as testing of operation and pattern lock, beam calibration, and target writing proper.

In a further development of the invention, which is in particular in line with the PML2 concept, a deflection array means, for instance in the form of a so-called blanking plate, is present which has a plurality of blanking openings located such that each of the beamlets traverses one of the blanking openings along a nominal path, wherein the deflection array means comprises a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode. Furthermore, the electrodes may be individually provided with a connecting line for applying an electrostatic potential and, in conjunction with an associated counter electrode, configured to deflect a beamlet traversing the respective blanking opening by an amount sufficient to deflect the beamlet off its nominal path when applied an activating voltage against the respective counter electrode The device according to the invention may comprise an opening array means which is separate from the deflection array means. This opening array means may realize a cover plate or a beam selection plate located between other plate components of the device.

In a simple realization of the invention, the deflection array means (blanking plate) may be configured as opening array means. In this case, it is advantageous to orient this component such that the deflector electrodes are located at a side of the deflection array means oriented away from the incoming beam.

The sets of apertures may cover different areas on the field of the aperture array means, which could be used to expose areas on the target with different dice sizes. A spatially larger or smaller beam array also allows the implementation of varying requirements of optical blur and writing strategy. To this end, the aperture sets may extend over different but overlapping areas on the aperture array means, preferably realizing consecutively increasing areas, wherein one area may be contained in the next.

In another development of the invention the positioning means may be configured to adjust the position of the aperture array means only, whereas the opening array means, and possibly also the deflection array means (blanking plate), are then fixed within the device.

The arrangement of the apertures in a set of apertures may be varied slightly in order to introduce a certain pre-distortion of the patterned beam, for instance to compensate a distortion introduced by imaging errors of the projection system that is used to project the pattern produced in the PD device to the target. In this case, the positions of the apertures in at least one of the sets of apertures may deviate from the exact position of a rectangular or oblique lattice by fine-placement displacements such that these fine-placement displacements correct for imaging errors of a projection system operated in conjunction with the device, wherein the position of each aperture including its fine-placement displacement falls within the region defined by a projection of the corresponding opening of the opening array means onto the aperture array means, said projection being along the direction of the beam provided that the respective sets of apertures in the aperture array means is in alignment with the plurality of openings in the opening array means.

Of course, various sets of apertures may be present which exhibit different fine-placement distributions, realizing different pre-distortions to the patterned beam. Thus, the pre-distortion of the beam can be changed by selecting the best suitable aperture set after an in-situ calibration, which can be done by scanning the beam array over a beam position detector, resolving a single beam position vector or group of beam position vectors relative to the other beams (e.g. by a simple knife edge with Faraday cup), and using the positional information to calculate the distortion state.

Furthermore, the aperture array means may comprise several sub-regions with apertures, which may even not overlap (or only marginally); in this aspect of the invention, the positioning means will have to provide an offset range sufficient to move the aperture array means to said different sub-regions.

In order to achieve an alignment between one of the sets of apertures and the openings in the openings array means in a device according to the invention, a method can be used that comprises the following steps: (i) irradiating the device with a beam of charged particles, (ii) measuring the current which is transmitted through the device as a function of varying relative positioning of the aperture array means and opening array means in terms of positioning parameters, (iii) determining the values of the positioning parameters of a maximum value of the transmitted current, and (iv) adjusting the positioning of the aperture array means relative to the opening array means according to said values of the positioning parameters.

The present invention lends itself for a multi-pass writing method where each pass has different properties of the exposure, for instance different critical dimension. Such a method for multi-beam writing in a particle-beam processing or inspection apparatus using a multi-beam pattern definition device according to the invention may comprise the following steps: (i) writing a first pattern on a surface region on a target using the multi-beam pattern definition device with a first set of apertures in the aperture array means being in alignment with the openings in the opening array means, and then (ii) adjusting the positioning of the aperture array means so as to bring a second set of apertures in the aperture array means into alignment with the openings in the openings array means, and (iii) writing a second pattern on said surface region on the target. Steps (ii) and (iii) may be repeated as many times as desired for a different set of apertures.

BRIEF DESCRIPTION OF THE DRAWINGS

In the following, the present invention is described in more detail with reference to the drawings, which show in schematic form, respectively.

DETAILED DESCRIPTION OF THE INVENTION

The preferred embodiment of the invention discussed in the following is a development of the PML2-type particle-beam exposure apparatus and its pattern definition (PD) system, as disclosed in the above-mentioned U.S. Pat. No. 6,768,125 and US 2009/0200495 A1, having a large-reduction projecting system. In the following, first the technical background of the apparatus is discussed as far as relevant to the invention, then embodiments of the invention are discussed in detail. It should be appreciated that the invention is not restricted to the following embodiments or the particular layout of PD systems, which merely represent examples of possible implementations of the invention; rather, the invention is suitable for other types of processing systems that employ a particle-beam and a multi-beam patterning as well.

PML2 System

Figure 1:
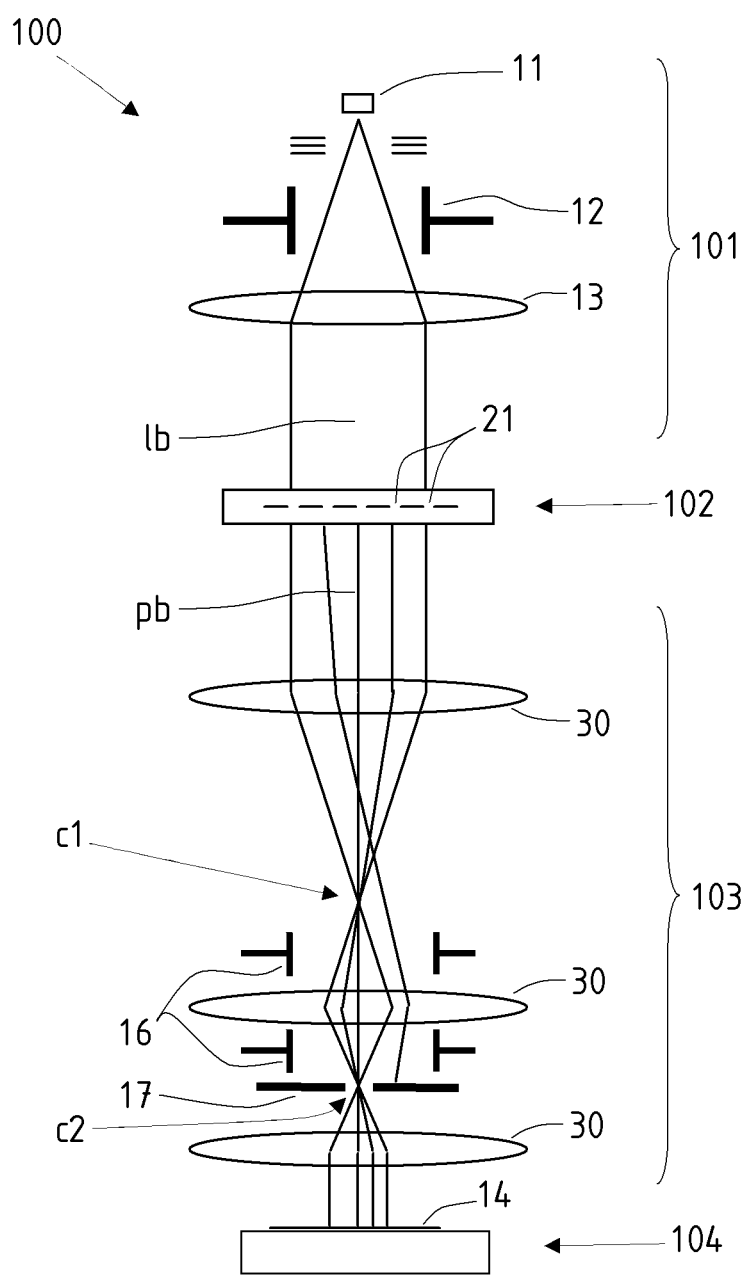
FIG. 1 an overview of a particle-beam exposure apparatus suitable for the invention in a longitudinal section.

A schematic overview of a maskless particle-beam processing apparatus PML2 employing the invention is shown in FIG. 1. In the following, only those details are given as needed to disclose the invention; for the sake of clarity, the components are not shown to size in FIG. 1, particularly the lateral width of the particle beam is exaggerated. For more details, the reader is referred to the U.S. Pat. No. 6,768,125 and US 2009/0200495 A1, whose teachings with respect to the overall layout of the particle-beam apparatus and the PD means are herewith included by reference.

As already mentioned, a particle beam generated by a particle source is used in the PML2 system. An illumination optical system forms the beam into a wide beam which illuminates a PD means having a regular array of apertures in order to define a beam pattern to be projected on a target surface. With each aperture, a small beam (also referred to as 'beamlet') is defined, and the passage of each beam through an aperture can be controlled so as to allow ('switch on') or effectively deactivate ('switch off') the passage of particles of the beam through the respective apertures towards the target. The beam permeating the aperture array forms a patterned particle beam bearing pattern information as represented by the spatial arrangement of the apertures. The patterned beam is then projected by means of a particle-optical projection system onto the target (for instance, a semiconductor substrate) where an image of the apertures is thus formed to modify the target at the irradiated portions. The image formed by the beam is moved along a straight path over each die field; additional scanning of the beam in a direction perpendicular to the scanning direction is not necessary (except, where needed, to compensate for lateral travel motion errors of the scanning stage).

The main components of the apparatus 100 are—in the order of the direction of the lithography beam lb, pb which in this example runs vertically downward in FIG. 1—an illumination system 101, a PD system 102, a projecting system 103, and a target station 104 with the target or substrate 14. The particle-optical systems 101, 103 are realized using electrostatic or electromagnetic lenses. The electro-optical parts 101,102,103 of the apparatus 100 are contained in a vacuum housing (not shown) held at high vacuum to ensure an unimpeded propagation of the beam lb, pb along the optical axis of the apparatus.

The illumination system 101 comprises, for instance, an ion source 11, an extractor arrangement defining the location of the virtual source, a particle filter/general blanker 12 and an illumination optics realized by a condenser lens system 13. The ions used can be, for instance, hydrogen ions or heavy ions; in the context of this disclosure heavy ions refer to ions of elements heavier than C, such as O, N, or the noble gases Ne, Ar, Kr, Xe. Apart from ions, the particles can be electrons (emitted from an electron gun) or, in general, other electrically charged particles can be used as well.

The ion source 11 emits energetic ions of primarily a certain species, such as hydrogen or $Ar^+$ ions having a defined (kinetic) energy of typically several keV (e.g. 5 keV at the PD system 102) with a comparatively small energy spread of, e.g., $\Delta E = 1$ eV. A velocity/energy de-pendent filter 12 serves to filter out other, unwanted particle species that may also be produced in the source 11; the filter 12 may also be used to blank out the beam as a whole during repositioning of the beamlets. By means of an electro-optical condenser lens system 13, the ions emitted from the source 11 are formed into a wide-area, substantially telecentric ion beam serving as lithography beam lb. The telecentricity of the beam is within a range of ±25 µrad deviation from the optical axis at the position of the PD device, resulting in a telecentricity range of ±5 mrad deviation from the optical axis at the position of the substrate, assuming here a 200× reduction system and equal particle energies at PD device and substrate.

The lithography beam lb then irradiates a PD device which, together with the devices needed to keep its position, forms the PD system 102. The PD device is held at a specific position in the path of the lithography beam lb, which thus irradiates an aperture pattern formed by a plurality of apertures 21. As already mentioned, each of the apertures can be "switched on" or "open" so as to allow the beamlet passing through the respective aperture to reach the target; it is then said, the aperture is transparent to the incident beam. Otherwise, the aperture is "switched off" or "closed", in which case the beam path of the respective beamlet is affected in a way that it will be absorbed or otherwise removed out of the beam path before it can reach the target; thus, the aperture is effectively non-transparent or opaque to the beam. The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets are shown in the patterned beam pb, while it will be clear that the actual number of beamlets is very large; of the beamlets shown, the second from the left is depicted switched off as it is absorbed on an absorbing plate 17; the other beamlets, which are switched-on, pass through a central opening of the plate 17 and thus are projected onto the target.

The pattern as represented by the patterned beam pb is then projected by means of an electro-optical projection system 103 onto the substrate 14 where it forms an image of the switched-on mask apertures. The projection system 103 implements a demagnification of, for instance, 200×. The substrate 14 is, for instance, a silicon wafer covered with a photo-resist layer. The wafer 14 is held and positioned by a wafer stage (not shown) of the target station 104. A detector 15 for secondary radiation can be used to detect the proper positioning of the substrate with respect to the beam.

The projection system 103 is preferably composed of two consecutive electro-optical projector stages with a crossover c1, c2, respectively. The electrostatic lenses 30 used to realize the projectors are shown in FIG. 1 in symbolic form only as technical realizations of electrostatic imaging systems are well known in the prior art; in other embodiments of the invention, also magnetic and/or electromagnetic lenses may be included as suitable. The first projector stage images the plane of the apertures of the PD device to an intermediate image which in turn is imaged onto the substrate surface by means of the second projector stage. Both stages em-ploy a demagnifying imaging through crossovers c1,c2; thus, while the intermediate image is inverted, the final image produced on the substrate is upright (non-inverted). The demagnification factor is about 14× for both stages, resulting in an overall demagnification of 200×. A demagnification of this order is in particular suitable with a lithography setup, in order to elevate problems of miniaturization in the PD device. The electrooptical lenses are mainly composed of electrostatic electrodes, but magnetic lenses may also be used.

As a means to introduce a small lateral shift to the image, i.e. along a direction perpendicular to the optical axis cx, deflection means 16 are provided in one or both of the projector stages. Such deflection means can be realized as, for instance, a multipole electrode system, as discussed in the U.S. Pat. No. 6,768,125. Additionally, a magnetic coil may be used to generate a rotation of the pattern in the substrate plane where needed. The lateral deflections are usually quite small in comparison to the lateral width of the patterned beam by itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam bp).

By controlling the pattern formed in the PD system 102, an arbitrary beam pattern can be generated and transferred to a substrate. Suitably, a scanning stripe exposure strategy, where the substrate is moved under the incident beam, is utilized so a beam-scanning strategy is not required, where the position of the beam is perpetually changed and thus the beam is effectively scanned over the target surface (which is at rest or only slowly moved, with a far smaller velocity) like in case of a single focused beam system. Details of the exposure strategy can be found in the already-mentioned prior art, in particular U.S. Pat. No. 6,768,125.

Pattern Definition System, Plate Architecture

Figure 2:
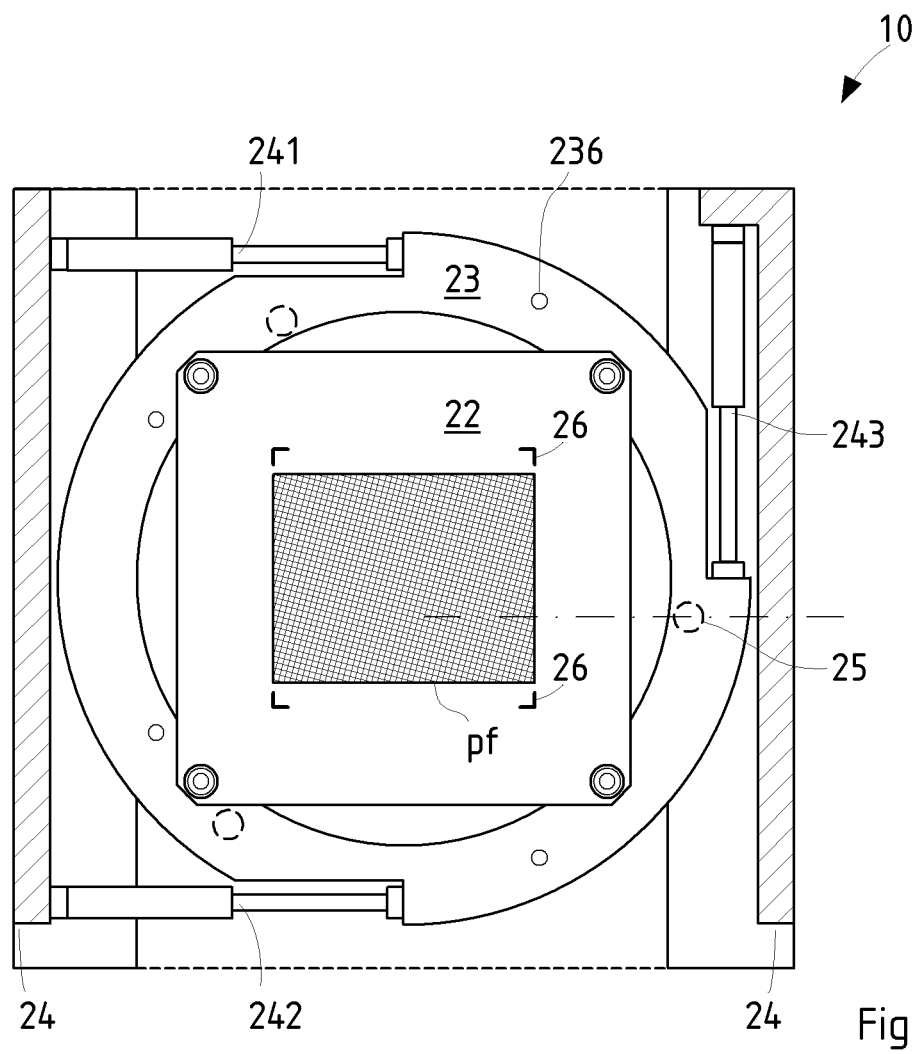
FIG. 2 a top view of a PD system.
Figure 3:
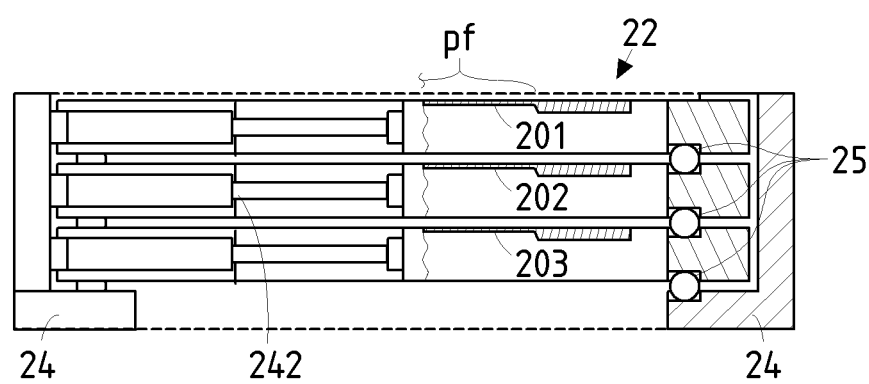
FIG. 3 a side and sectional view (left and right halves, respectively) of the PD system of FIG. 2.
Figure 4:
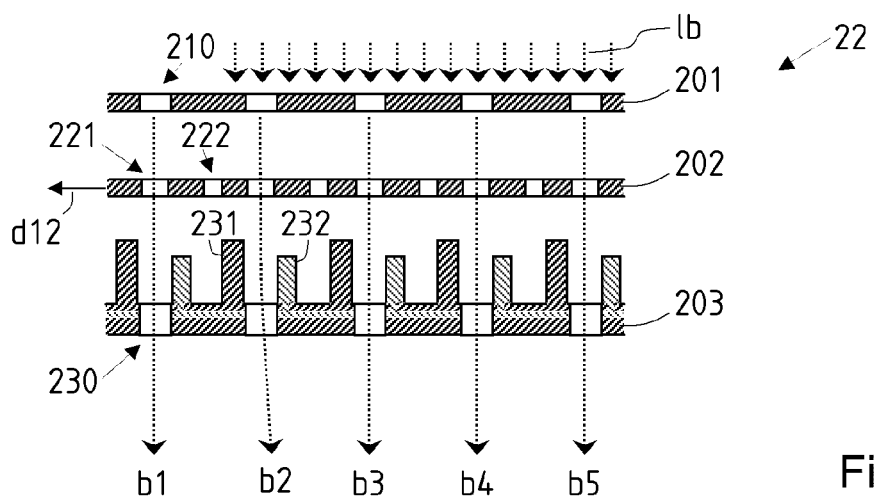
FIG. 4 a sectional detail of a PD setup according to the invention having a three-plate configuration, in which an aperture plate comprises two sets of apertures and the first set of apertures is activated.

FIGS. 2 and 3 show the PD system 102 of the apparatus 100, namely, in FIG. 2 a top view and in FIG. 3 a combined side and longitudinal-sectional view. FIG. 4 shows a detail of the sectional view in FIG. 3, a section of the plates of the PD system 102 along five beamlet paths.

The PD system 102 comprises a number of plates 22 mounted in a stacked configuration, realizing a composite device whose components serve respective functions, including for instance a cover plate 201, an aperture plate 202, and a blanking plate 203. Further component plates may also be present, such as an adjustment plate for individual fine adjustment of the beamlet paths (not shown here, cf. U.S. Pat. No. 6,768,125). Each of the plates 22 is realized as a semiconductor (in particular silicon) wafer in which the structures were formed by micro-structuring techniques known in the art, in particular a membrane portion formed in the middle of the plate, representing a PD field pf having a plurality of openings, symbolized by a cross-hatching in FIG. 2. The lithography beam traverses the plates through the consecutive openings in the PD field pf as further explained below with reference to FIGS. 4 to 6.

The plates 22 are held by chucks 23 which are positioned with respect to each other by means of actuator devices 241, 242, 243 which are realized as piezoactuators or nanopositioning elements of known type, attached to the chucks through flexure joints and fixed at a support structure 24 of the PD system. In the vertical direction the chucks are connected using slideable bearings 25. Preferably, the plates 22 and chucks 23 are produced from the same material, e.g. silicon, or materials having the same thermal expansion behavior in the operating temperature range. The chucks also provide for the electric supply of the blanking plate 202; for the sake of clarity, the electric lines are not shown in the figures.

In the plates 22 reference marks 26 may be provided for the definition of reference beams. The shape of the reference beams rb is defined, for instance, in an opening formed in one of the plates 22, for instance the cover plate 201, whereas the corresponding openings in the other plates are wide enough so as to let pass the radiation for the reference beams. The reference beams are then imaged together with the patterned beam pb; in contrast to the patterned beam, however, the reference beams do not reach the substrate 41 but are measured in an alignment system (cf. US 2009/0146082 A1). Furthermore, the chucks 23 may have alignment openings 236 which serve as alignment markers for relative positioning of the chucks 23 and the plates 22 they hold.

The thickness of the membrane portion in each of the plates 22 is about 30 to 100 μm; the membrane of the blanking plate may be thicker if this is suitable in view of better thermal conductivity. The frame portion of the plates is well thicker, in the order of 0.750 mm. The mutual distance of the plates is in the order of 0.5 to a few mm. It should be noted that in FIG. 4 the dimensions in the longitudinal axis (z-axis parallel to the optical axis of the apparatus) are not to scale.

FIG. 4 shows a cross section detail of the membrane portions of the plates 22 of FIG. 3; only the portion corresponding to the path of five beamlets out of a large number of beamlets in the PD field pf are shown. As already mentioned, the embodiment shown realizes a three-plate arrangement composed of three plates 201, 202, 203, of which the second plate 202 realizes an aperture array means in the meaning of the present invention while either of the first and third plates 201, 203 serve as opening array means according to the invention.

The first plate 201 is a cover plate having a set of openings 210 defining beamlets of a provisional shape (provisional beamlets). Thus, the cover plate 201 absorbs much of the energy of the beam so as to protect the further plates from the possibly adverse effects of the impinging radiation.

The second plate is an aperture array means realized as an aperture plate 202 having a multiple sets of apertures 221, 222 as further explained below. The provisional beamlets permeate certain of the apertures 221 of plate 202, and thus are formed into a corresponding number of beamlets b1, b2, b3, b4, b5. To this end the openings 210 in the cover plate have a width which is larger than the apertures 221, 222.

The third plate 203 of the PD system 200 is a deflection array plate, usually called blanking plate. It has a set of openings 230 whose positions correspond to the path of beamlets b1-b5 as pre-determined by the cover plate 201; but the openings 230 have widths that are greater than those of the apertures 221, 222 (in other words, the openings 230 are larger) so the beamlets pass through the former without affecting the blanking plate material. Each of the openings 230 is provided with electrodes 231, 232 so as to be able impart a small but sufficient deflection to the corresponding beamlet, depending on an electric voltage selectively applied between each pair of electrodes 231, 232; for instance, one electrode 231 is held at a ground potential and serves as counter electrode, while the other electrode 232 serves as active electrode which is connected with a circuit layer of the blanking plate 203 for applying a electric potential for deflecting the selected beamlet(s) b1. Each beamlet can thus be deflected individually. The blanking plate also comprises the circuitry for electronic controlling and electric supply of the electrodes. Further details of a PD device, including details of the circuitry of a blanking plate, are discussed in U.S. Pat. No. 6,768,125, US 2009/0200495 A1, as well as in US 2008/0237460 A1 of the assignee/applicant.

Each beamlet b1-b5 transgresses the subsequent openings of the plates 22 along its nominal path provided the corresponding blanking electrodes 231, 232 are not energized; this corresponds to the "switched-on" state of the aperture. A "switched-off" aperture is realized by energizing the electrodes, namely, applying a transverse voltage. In this state, as shown with beamlet b2, the corresponding blanking electrodes 231, 232 deflect the beamlet b2 off its nominal path so the beamlet is deflected to a (slightly but sufficiently) different path which eventually leads to some absorbing surface, preferably on a blocking aperture 17 located around of one of the crossovers c1, c2 (FIG. 1).

It should be emphasized that it is the apertures formed in the aperture plate 202 (rather than the initial opening in the cover plate 201) which define the lateral shape of the beamlets emerging from the PD system 102. Therefore, the term 'aperture', when used in relation to the definition of a pattern to be produced on the target, is reserved to the openings of defined shape and width (FIG. 6) as determined by the beamlet-defining apertures 221, 222 in the aperture plate.

Aperture Plate and Multiple Aperture Grids

Figure 5:
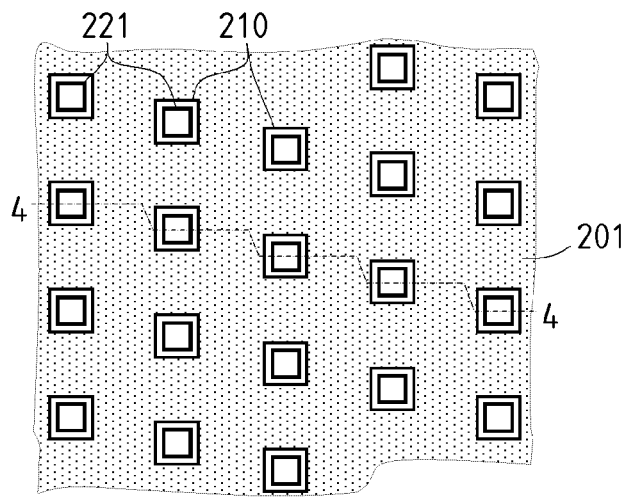
FIG. 5 a top view of a portion of the PD setup corresponding to FIG. 4.
Figure 6:
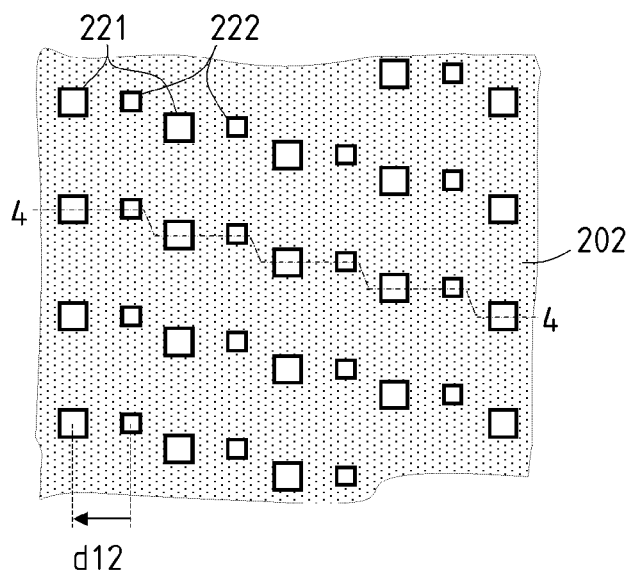
FIG. 6 a top view of a portion of the aperture plate of the PD setup of FIG. 4.

The apertures 221, 222, and preferably the corresponding openings 230 in the blanking plate as well, are arranged in a systematic manner along defined grids. Each grid is, for instance, a regular array forming staggered lines running parallel to a direction which corresponds to the relative movement of the images of the apertures over the target as described in the U.S. Pat. No. 6,768,125. In each line of the staggered arrangement the offset between consecutive apertures is preferably a multiple of a grid width underlying the aperture arrangement, while the lines run immediately side by side such that the aperture image completely cover the target in the course of the scanning movement over the target. The openings shown in FIGS. 5 and 6 show realizations of such a staggered arrangement. In a more general grid arrangement the apertures will be located on the points of a substantially regular two-dimensional lattice, but the lattice may additionally have small deviations from an exact regular lattice in order to account for possible distortions in the imaging system, so as to compensate such imaging errors by small deviations in the positions of the apertures and achieve an exact, compensated position of the respective aperture images on the target.

FIG. 5 shows a plan view on the portion of the PD device of FIG. 4, as seen along the direction of the irradiating beam. The major part of the surface visible is made up by the upper surface of the cover plate 201, displaying the regular array of openings 210 formed in the cover plate. Through each of the openings 210 the shape of the corresponding aperture 221 is visible while the blanking plate is completely hidden by the cover and aperture plates. The line 4-4 depicts the line of section for the cross section shown in FIG. 4.

According to the invention, the aperture plate comprises multiple sets of apertures, wherein each set of apertures can be selected to be imaged onto the target.

FIG. 6 shows a plan view detail of the portion of the aperture plate 202 corresponding to FIG. 5, with the cover plate 201 removed. The line 4-4 depicts the line of section for the cross section shown in FIG. 4. The aperture plate 202 has two interlacing grids of apertures, each referred to by reference numbers 221 and 222, wherein each grid is formed of a plurality of apertures of substantially the same shape arranged in a substantially regular array (possibly including small deviations for compensating imaging distortion as discussed more in detail below). Either of the two sets of apertures 221 and 222, when taken alone, forms an aperture grid as known from prior art, but each has a different aperture shape, which allows different modes of exposure of the target.

Figure 4A:
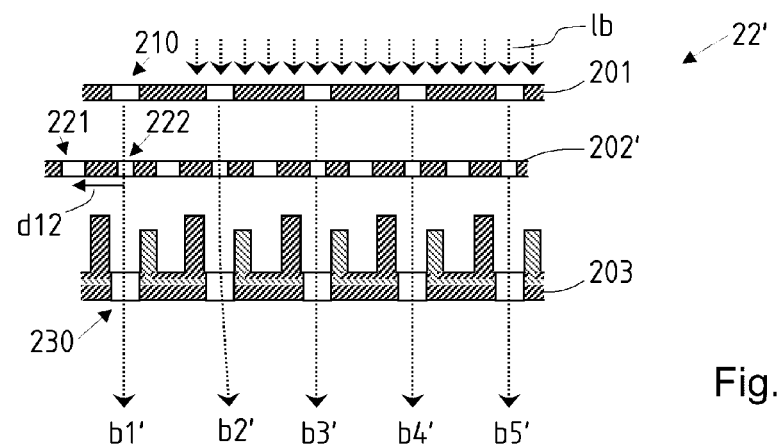
FIG. 4a a variant of FIG. 4 with the aperture plate shifted to activate a second set of apertures.

Referring to FIG. 4a the aperture plate 202 can be shifted by a displacement d12, effected by means of the actuation devices 241, 242, 243 (FIGS. 2 and 3), in order to activate the second grid of apertures 222 of the aperture plate 202. This is in contrast to the position of apertures shown in FIGS. 4 and 5 where the grid of apertures 221 is activated. Thus, depending on the positioning of the aperture plate 202 relative to the other plates (cf. FIGS. 4 and 4*a*), each grid of apertures 221, 222 can be shifted into a proper position by a simple lateral translation, so as to match with the corresponding opening grids in the cover and blanking plates. At any time, only one of the grids of apertures is cooperating with the openings in the cover and blanking plates, so as to define the shape of the beamlets produced in the PD system. It is remarked that in the depiction of FIG. 5 the apertures 222 of the second grid in the aperture plate 202 are hidden by the cover plate 201.

Figure 7:
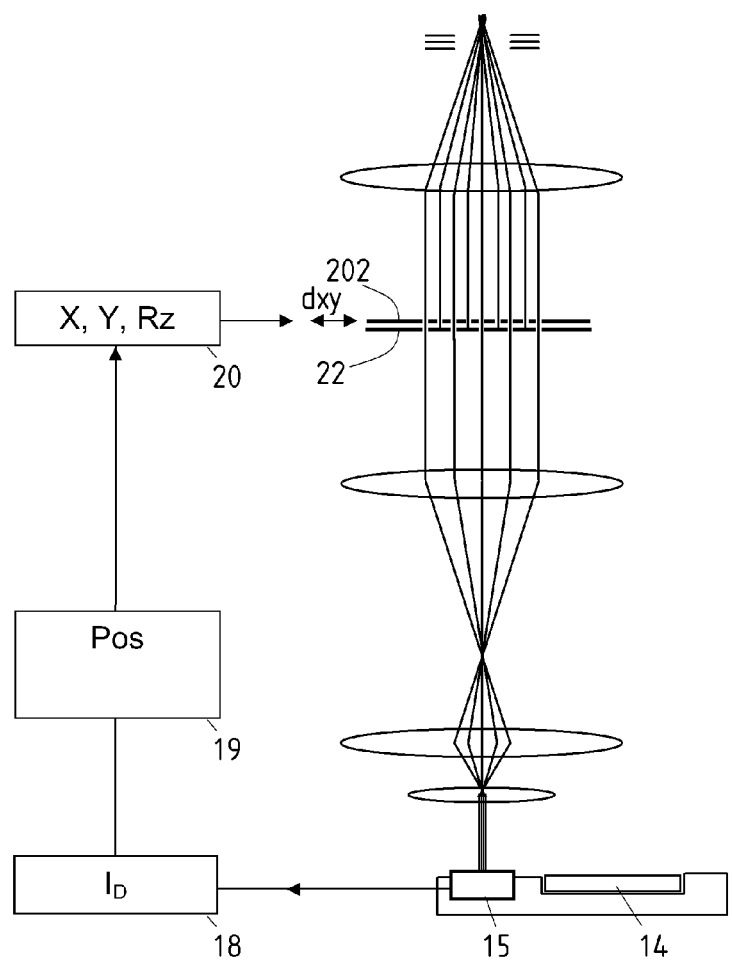
FIG. 7 the positioning control of the aperture plate within the PD setup.

FIG. 7 illustrates the positioning control of the aperture plate according to the invention. The positioning process of the aperture plate 202 is achieved by means of a position control loop as shown, formed by a Faraday cup 15, a current detection system 18, a computer or other processor device serving a positioning controller 19, an actuation controller 20 feeding the individual actuators, here symbolized by the reference symbol dxy, the aperture plate 202, and the imaging of the apertures within the particle-beam apparatus itself. The Faraday cup 15 is moved below the optical column of the particle-beam apparatus for the duration of the positioning process, in place of the target 14 that is otherwise exposed. It measures the total amount of beam current ID that is transferred to the target stage. The beam current ID depends on the positioning of the apertures relative to the openings of the other plates 22 in the PD system, and generally will exhibit a maximum at proper alignment. The positioning controller 19 records the beam current as a function of the position—in terms of lateral shifts in X and Y directions and rotation Rz within the XY plane—and uses the in-situ current feedback to optimize the position of the aperture plate 202 with respect to the position of the other plates 22. The actuation controller 20 serves as interface converting the control signals from the controller 20 into signals (e.g. voltages) suitable for driving the actuation devices 241, 242, 243 (FIG. 2).

For instance, the positioning process can be as follows. As a first step, a coarse position is set which matches the grid position of the desired aperture shape. The coarse position may be pre-programmed or a recorded position from a previous positioning process, and may achieve a positioning accuracy of, for instance ±50 µm. Then, the aperture plate is mechanically scanned within a range in the XY plane of the mentioned positioning accuracy, with a pre-defined step width, for instance by 2 to 4 µm (typical beam size) and angles of 0.5 mrad; the current ID is recorded during this scan, which will produce a "current map" as function of the position and rotation parameters X, Y, Rz. A maximum of the current in this current map is then determined, using a suitable interpolation technique. If required, the steps of scanning and evaluating of the current map can be iterated in a sub-range determined to contain the maximum, with a decreased scan step width, e.g. below the µm range, such as 0.5 µm. Finally, once the optimal parameters X, Y, Rz of the position of maximum is deter-mined, the aperture plate is moved to this position. The Faraday cup 15 is removed and an exposure process with the aperture grid thus selected can be started.

In a variant the positioning process can be done by optical alignment within the PD device, for instance using a sequence of reference marks 26 or alignment openings 236 formed in the consecutive plates 22, using also a light source and a light sensor arranged at opposite sides (i.e., above and below the device in FIG. 3) and controlling the alignment by measuring the amount of light that passes through the sequence of openings. For that purpose, the relevant opening 26, 236 used in the aperture plate 202 will be duplicated with the individual instances of the opening offset to each other in the same manner as the sets or apertures.

It should be appreciated that in other realizations of the invention, not all chucks 23 need be provided with actuation devices for positioning of the respective plates 22. I will be clear that for the chuck of the plate 201 and/or that of the plate 203 the actuators are optional, pro-vided that the positioning of the aperture array plate can be adjusted relative to the other plates. Thus, for instance, the plate 201 or the plate 203 may be held by a chuck that is mounted fixed within the PD system 102.

Figure 8:
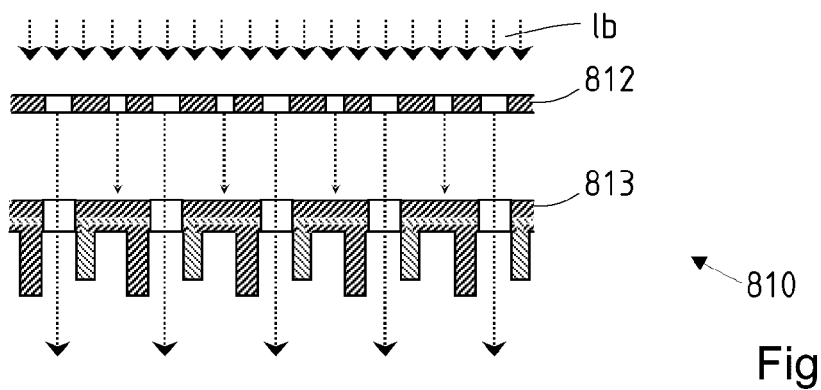
FIG. 8 a variant of a PD setup with a two-plate configuration.

FIG. 8 shows a variant of a PD system configuration 810 having only two plates, namely an aperture plate 812 and a blanking plate 813. The aperture plate 812 forms the beamlets directly from the beam lb impinging on it. The selection of the beamlets is made by control of the positioning between the aperture and blanking plates 812, 813. Only the beamlets corresponding to apertures selected in this way (shown as long dotted arrow lines) can pass the blanking plate 813, while the other beamlets (shown as small dotted arrow lines ending just above the plate 813) are absorbed, or stopped, on the surface of the blanking plate 813 that is oriented towards the incoming beamlets. The blanking plate 813 in this configuration is preferably oriented such that the electrodes and circuitry is located away from the incoming beam (i.e., on the lower side of plate 813 in FIG. 8). In the other respects this configuration has equivalent features to that of FIGS. 4 to 6.

The configuration could also be inverted, with the blanking plate disposed in front (i.e., upstream) of the aperture plate, as seen along the direction of the beam. Due to the undesired effect of beam irradiation and of radiation scattering, a configuration will generally be preferred with the blanking plate being not the initial plate.

Figure 9:
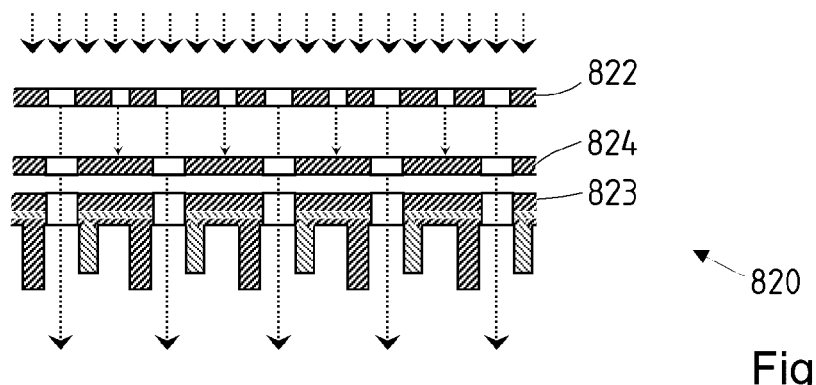
FIG. 9 another variant of a PD setup with a three-plate configuration.

FIG. 9 shows another variant configuration 820, which is provided with a third plate 824 disposed between the aperture plate 812 and the blanking plate 823. The plate 824 serves as 'beam selection plate' which lets pass only the selected beamlets but stops the other beamlets, whereas the blanking plate 823 is now free of direct contact with the radiation and its possibly harmful effects. The beam selection plate 824, which itself can be replaced easily, thus helps to enhance the lifetime of the blanking plate, which is advantageous since the latter contains a delicate structure of logics circuitry and electrodes. In the other respects this configuration has equivalent features to that of FIGS. 4 to 6 and, in particular, FIG. 8.

Figure 10:
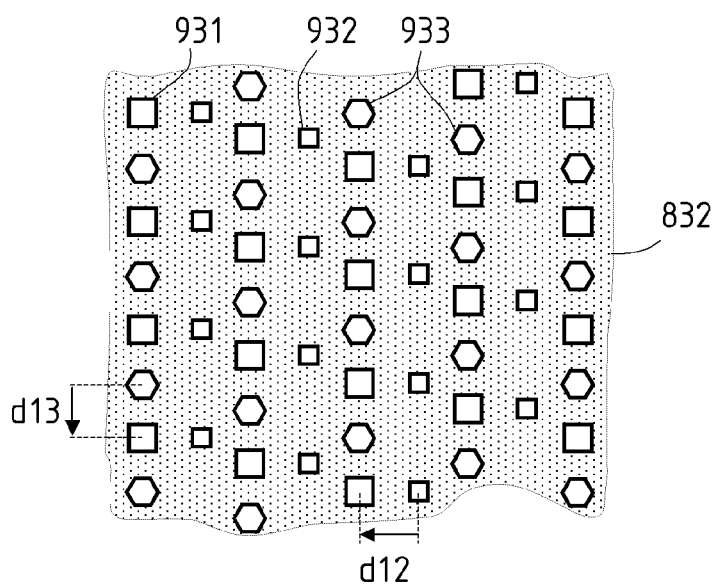
FIG. 10 a variant of an aperture plate having three sets of apertures.

The invention allows the realization not only of two interlacing grids of apertures, but generally any suitable number. FIG. 10 shows an aperture plate 832 having three grids with apertures 931, 932, 933 of different size and shape. The displacements d12, d13 between these grids may be along different directions, for instance along the orthogonal X and Y directions of the object plane of the optical system. The notation used here for the displacement is the vector to replace the first set of apertures by another set; for instance d12 denotes the displacement which will replace the first set of apertures 931 by the second set 932. Here, the position of the first set is (arbitrarily) taken as reference. Depending on which displacement is realized—namely none, d12 or d13—one of the grids 931, 932, 933 is activated as described by the methods above.

Figure 11:
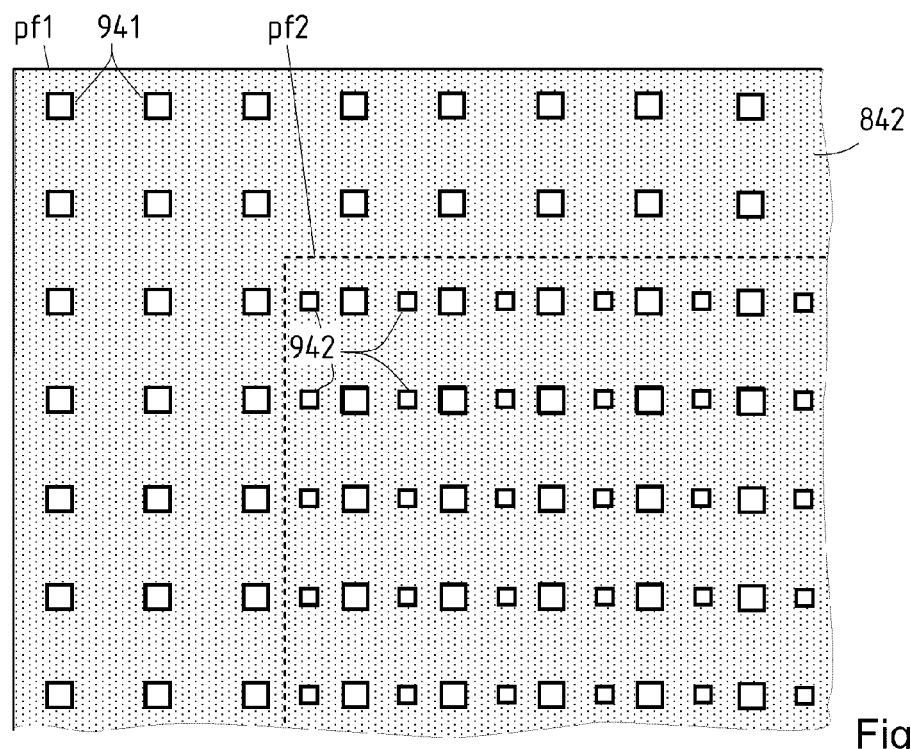
FIG. 11 another variant of an aperture plate, in which the aperture sets are of different sizes.

FIG. 11 illustrates another advantageous aspect of the invention, the implementation of pattern fields of different sizes. FIG. 11 shows the left upper corner of a pattern field of an aperture plate 842. While a first grid of aperture 941 covers a first pattern field pf1, which for instance extends over the entire range of the membrane portion, a second grid of apertures 942 has a reduced extension of a second pattern field pf2. The total number of apertures in the second pattern field is likewise reduced since the basic mutual arrangement of apertures within a grid is the same (so as to maintain the correspondence with the openings in the other plates). The size and shape of the apertures in the smaller grid may be different or the same as those in the larger grid.

Figure 12:
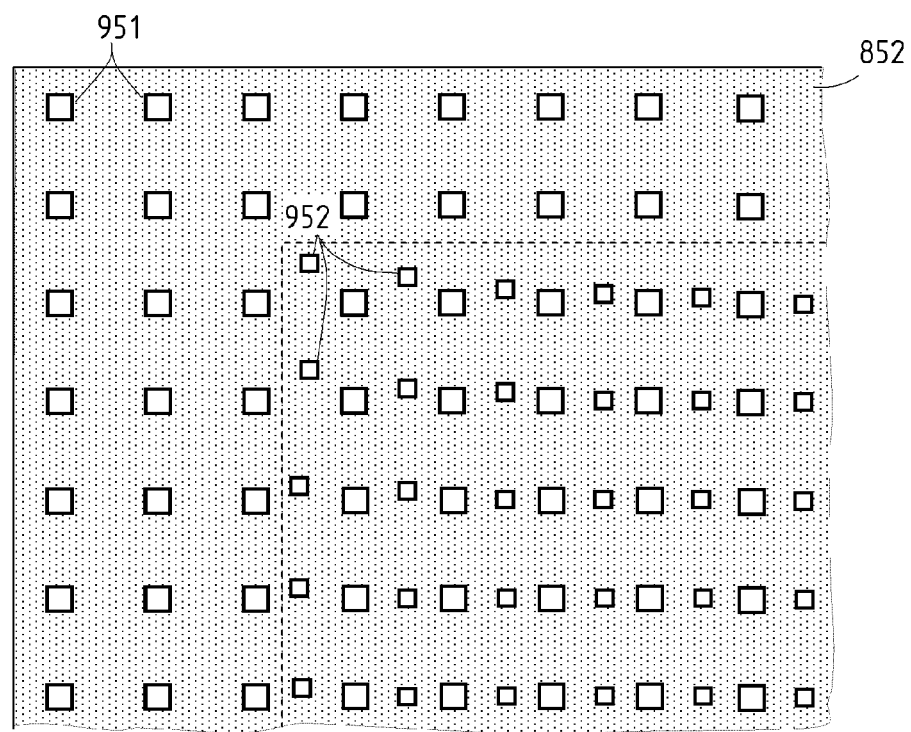
FIG. 12 yet another variant of an aperture plate, in which one of the aperture sets comprise fine placement deviations for compensating an imaging defect.

FIG. 12 illustrates a further advantageous aspect, wherein the location of the apertures are shifted by small amounts within the grids so as to compensate imaging errors. These distributions of fine placement may also be vary in different ways for different grids. For instance, the apertures 951 of one grid may have little or no deviation from the basic regular arrangement, while the apertures 952 of another grid have such deviations realizing a fine placement to introduce, for instance, a pincushion-like distortion which can compensate a barrel-like distortion of the optical projection system 103. The extent of the fine placement deviation (which are depicted exaggerated in FIG. 12) is limited by the size of the respective corresponding opening in the other plates of the PD device. For a typical worst case of a beam displacement of 2 nm resulting from electron-optical distortion, the center of the apertures will have to be shifted by 200×2=400 nm, assuming a reduction factor of 200. This distance is usually well within the margin of the blanking plate opening diameter. Of course the grids may also have different grid sizes and/or different size/shape of the apertures within each grid; but, if suitable, the grid size and/or the aperture shapes may be the same, as deemed suitable in the individual case.

The invention claimed is:

1. A multi-beam pattern definition device for use in a particle-beam processing or inspection apparatus, said device being adapted to be irradiated with a beam of electrically charged particles and allow passage of the beam through a plurality of apertures thus forming a corresponding number of beamlets, said device comprising:
   an aperture array means in which said apertures are realized, wherein the aperture array means comprises at least two sets of apertures, each set of apertures comprising a plurality of apertures arranged in a substantially regular arrangement on the aperture array means with the arrangements of said sets being interlacing at least partially, wherein the apertures of different sets are, at least in a region where the arrangements are interlacing, offset to each other by displacements which correspond to a common displacement vector,
   an opening array means having a plurality of openings configured for the passage of at least a subset of beamlets that are formed by said apertures, wherein, in at least a region corresponding to said region of interlacing of arrangements, the opening array means comprises plurality of openings arranged in a substantially regular arrangement, said arrangement corresponding to the arrangement of one of said sets of apertures in said region and lacking openings at locations corresponding to apertures of the other set(s) of apertures, and
   positioning means for positioning at least one of the aperture array means and the opening array means for adjusting the relative position of the aperture array means with respect to the opening array means, said positioning means being configured to selectively bring a selected set of the sets of apertures in the aperture array means into alignment with the plurality of openings in the opening array means in at least said region of interlacing of arrangements.

2. The device of claim 1, further comprising a deflection array means having a plurality of blanking openings located such that each of the beamlets traverses one of the blanking openings along a nominal path, the deflection array means comprising a plurality of electrostatic deflector electrodes, each of which is associated with a blanking opening and is configured to deflect a beamlet traversing the respective blanking opening by an amount sufficient to deflect the beamlet off its nominal path when an activating electric voltage is applied to the respective electrode.

3. The device of claim 2, comprising at least one opening array means which is separate from the deflection array means.

4. The device of claim 2, wherein the deflection array means is configured as an opening array means.

5. The device of claim 4, wherein said deflector electrodes are located at a side of the deflection array means oriented away from an incoming beam.

6. The device of claim 1, wherein the sets of apertures extend over different but overlapping areas on the aperture array means.

7. The device of claim 1, wherein the apertures within each set have an equivalent shape and size, whereas the apertures of different sets differ in at least one of their size and their shape.

8. The device of claim 1, wherein the aperture array means and the at least one opening array means are realized as plate-like devices oriented substantially perpendicular to the beam, and having a membrane portion designed for being disposed in the path of the beam.

9. The device of claim 1, wherein the positioning means are configured to adjust the position of the aperture array means only, whereas the opening array means is fixed within the device.

10. The device of claim 1, wherein the positions of the apertures in at least one of the sets of apertures deviate from the exact position of a rectangular or oblique lattice by fine-placement displacements, said fine-placement displacements being designed to correct for imaging errors of a projection system operated in conjunction with the device, wherein the position of each aperture including its fine-placement displacement falls within the region defined by a projection of the corresponding opening of the opening array means onto the aperture array means, said projection being along the direction of the beam under the condition that the respective sets of apertures in the aperture array means is in alignment with the plurality of openings in the opening array means.

11. The device of claim 1, wherein the aperture array means comprises several sub-regions with apertures, and the positioning means are designed to provide an offset range sufficient to move the aperture array means to said different sub-regions.

12. A method for alignment in a device according to claim 1, namely an alignment between one of the sets of apertures and the openings in the openings array means, comprising:
   irradiating the device with a beam of charged particles,
   measuring the current which is transmitted through the device as a function of varying relative positioning of the aperture array means and opening array means in terms of positioning parameters,
   determining the values of the positioning parameters of a maximum value of the transmitted current, and
   adjusting the positioning of the aperture array means relative to the opening array means according to said values of the positioning parameters.

13. A method for multi-beam writing in a particle-beam processing or inspection apparatus having a multi-beam pattern definition device according to claim 1, comprising:
   writing a first pattern on a surface region on a target using the multi-beam pattern definition device with a first set of apertures in the aperture array means being in alignment with the openings in the opening array means,
adjusting the positioning of the aperture array means so as to bring a second set of apertures in the aperture array means into alignment with the openings in the openings array means, and
writing a second pattern on said surface region on the target.

* * * * *